US012092696B2

(12) United States Patent
Munakata et al.

(10) Patent No.: US 12,092,696 B2
(45) Date of Patent: Sep. 17, 2024

(54) SIMULATED BATTERY CONSTRUCTION METHOD AND SIMULATED BATTERY CONSTRUCTION DEVICE

(71) Applicant: Toyo System Co., Ltd., Iwaki (JP)

(72) Inventors: Ichiro Munakata, Iwaki (JP); Hideki Shoji, Iwaki (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 84 days.

(21) Appl. No.: 17/422,295

(22) PCT Filed: Dec. 16, 2020

(86) PCT No.: PCT/JP2020/046938
§ 371 (c)(1),
(2) Date: Jul. 12, 2021

(87) PCT Pub. No.: WO2021/131958
PCT Pub. Date: Jul. 1, 2021

(65) Prior Publication Data
US 2022/0317193 A1    Oct. 6, 2022

(30) Foreign Application Priority Data
Dec. 27, 2019    (JP) .................................. 2019-238569

(51) Int. Cl.
*G01R 31/3842*    (2019.01)
*G01R 31/36*    (2020.01)
(Continued)

(52) U.S. Cl.
CPC ..... *G01R 31/3842* (2019.01); *G01R 31/3648* (2013.01); *G01R 31/385* (2019.01);
(Continued)

(58) Field of Classification Search
CPC ............ G01R 31/3842; G01R 31/3648; G01R 31/385; G01R 31/392; G01R 31/374;
(Continued)

(56) References Cited

U.S. PATENT DOCUMENTS

| 10,222,426 B2 | 3/2019 | Wang et al. | |
| 2007/0252601 A1* | 11/2007 | Satoh | ................... G01R 31/389 324/430 |
| 2013/0030736 A1 | 1/2013 | Tanaka | |
| 2013/0335031 A1 | 12/2013 | Joe et al. | |
| 2014/0372054 A1 | 12/2014 | Wang et al. | |

FOREIGN PATENT DOCUMENTS

| CN | 102901928 A | 1/2013 |
| GB | 2532726 A | 6/2016 |

(Continued)

OTHER PUBLICATIONS

Westerhoff et al.( Analysis of Lithium-Ion Battery Models Based on Electrochemical Impedance Spectroscopy, Energy Technol., Aug. 18, 2016, 4, 1620, https://doi.org/10.1002/ente.201600154) (Year: 2016).*

(Continued)

*Primary Examiner* — Manish S Shah
*Assistant Examiner* — Christian T Bryant
(74) *Attorney, Agent, or Firm* — Holtz, Holtz & Volek PC

(57) ABSTRACT

Parameters P(n0,n1,n2) of a rechargeable battery model at each of different temperatures T(n1) at each of different degradation degrees D(n2) are determined. The values of the parameters P(n0,n1,n2) of the rechargeable battery model are identified based on a measurement result of a complex impedance Z of a rechargeable battery 220. The rechargeable battery model expresses an impedance of an internal resistance of the rechargeable battery 220 with transfer functions representing the IIR and FIR systems, respectively. Further, a voltage command value Vcmd(t) in the case where a current command value Icmd(t) is input to a (Continued)

rechargeable battery model corresponding to the identifier id(m0), temperature T(m1), and degradation degree D(m2) of the virtual rechargeable battery to be simulated by a simulation battery 20 is calculated, and a voltage V(t) according thereto is applied to the designated apparatus 200 or its load by the simulation battery 20.

15 Claims, 11 Drawing Sheets

(51) Int. Cl.
*G01R 31/367* (2019.01)
*G01R 31/374* (2019.01)
*G01R 31/385* (2019.01)
*G01R 31/389* (2019.01)
*G01R 31/392* (2019.01)
*G06F 30/20* (2020.01)
*H01M 10/48* (2006.01)
*H02J 7/00* (2006.01)

(52) U.S. Cl.
CPC .......... *G01R 31/392* (2019.01); *G01R 31/367* (2019.01); *G01R 31/374* (2019.01); *G01R 31/389* (2019.01); *G06F 30/20* (2020.01); *H01M 10/48* (2013.01); *H02J 7/00* (2013.01); *Y02E 60/10* (2013.01)

(58) Field of Classification Search
CPC ..... G01R 31/367; G01R 31/389; Y02E 60/10; H01M 10/48; G06F 30/20; H02J 7/00
See application file for complete search history.

(56) References Cited

FOREIGN PATENT DOCUMENTS

| | | | |
|---|---|---|---|
| JP | 53070344 | A | 6/1978 |
| JP | 2005221487 | A | 8/2005 |
| JP | 2011122917 | A | 6/2011 |
| JP | 2012220199 | A | 11/2012 |
| JP | 2013160613 | A | 8/2013 |
| JP | 5924617 | B2 | 5/2016 |
| JP | 2016176924 | A | 10/2016 |

OTHER PUBLICATIONS

Chinese Office Action (and an English language translation thereof) dated Oct. 25, 2023, issued in counterpart Chinese Application No. 202080011623.2.
Extended European Search Report (EESR) dated Aug. 30, 2022, issued in counterpart European Application No. 20904547.5.
International Search Report dated Feb. 3, 2021 re PCT/JP2020/046938 (5 pages).

* cited by examiner

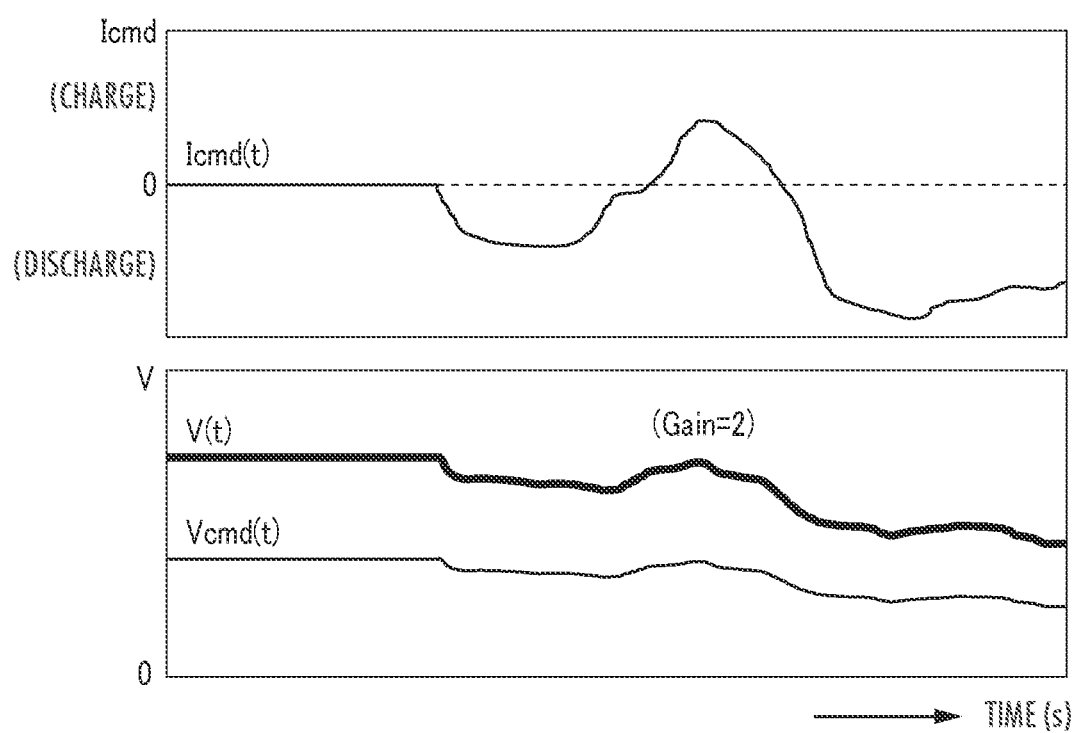

SIMULATED BATTERY CONSTRUCTION METHOD AND SIMULATED BATTERY CONSTRUCTION DEVICE

CROSS-REFERENCE TO RELATED APPLICATIONS

This patent application is a U.S. National Stage filing of, and claims priority to and all advantages of, PCT Patent Publication Number PCT/JP2020/046938 filed on Dec. 16, 2021 and Japanese Patent Application No. 2019-238569 filed on Dec. 27, 2019, the contents of both of which are incorporated herein by reference in their entireties.

TECHNICAL FIELD

The present invention relates to a technique for simulating the performance of rechargeable batteries such as lithium-ion batteries.

BACKGROUND ART

Changes in current-voltage behavior waveform of a rechargeable battery are discussed by defining the internal resistance of the rechargeable battery as an equivalent circuit constructed by connecting parallel circuits of resistor R and capacitor C in multiple stages. However, in order to explain the transient response waveform of the voltage for a few or more seconds, a capacitor capacitance value of several 100 F to several 1000 F would have to be used as the time constant element. Such values are not compatible with the AC impedance and its equivalent circuit model used for evaluating the AC characteristics of a battery, and cannot be said to reproduce the battery properties.

The internal resistance is one of the characteristic items of a rechargeable battery. For example, in a lithium-ion rechargeable battery, complicated chemical reactions such as electrode reactions, SEI reactions, ion diffusion reactions, etc. inside the battery occur in an intertwined manner, and the behavior of the battery voltage is not of the kind where Ohm's law can be applied by regarding the internal resistance as a mere DC resistance.

Conventionally, as a method for evaluating the internal resistance of a battery, an AC impedance analysis method based on frequency response analysis (FRA) is well known. A method has been established to interpret various internal reactions by decomposing them into a number of time constant elements by applying an equivalent circuit model. The behavior of a battery on the order of seconds is dominated by the diffusion phenomenon as Warburg resistance, and how well this Warburg resistance is incorporated into an operating model determines the performance as the model. In order to measure the AC impedance, a dedicated device such as a frequency response analyzer (FRA) is required.

CITATION LIST

Patent Literature

Patent Literature 1: Japanese Patent No. 5924617

SUMMARY OF INVENTION

Technical Problem

However, in practical use, the rechargeable battery is connected to a load and is repeatedly charged and discharged. In that case, only voltage, current, and temperature are measured as basic information to know the state of the rechargeable battery. Under these circumstances, the output voltage of the battery is affected by the internal resistance, and the internal resistance itself varies depending on the temperature conditions or the degree of degradation of the battery. There has been a need for a means that can reproduce with accuracy the characteristics of a battery in its actual operating state.

In view of the foregoing, it is an object of the present invention to provide a device or the like that can improve the accuracy in reproduction of the characteristics of a rechargeable battery by a simulation battery under various conditions.

Solution to Problem

A simulation battery construction device according to the present invention includes:

a first recognition element configured to recognize a measurement result of a complex impedance of a rechargeable battery;

a first calculation element configured to identify parameter values of a rechargeable battery model based on the measurement result of the complex impedance of the rechargeable battery recognized by the first recognition element, the rechargeable battery model expressing an impedance of an internal resistance of the rechargeable battery with transfer functions representing an IIR system and an FIR system, respectively;

a second recognition element configured to recognize a time series of a current command value;

a second calculation element configured to calculate a time series of voltage as an output of the rechargeable battery model by inputting the time series of the current command value recognized by the second recognition element to the rechargeable battery model; and a simulation battery control element configured to control an operation of a simulation battery connected to a designated apparatus so as to cause the time series of the voltage calculated by the second calculation element to be applied to the designated apparatus.

In the simulation battery construction device of the present invention, it is preferable that the first recognition element recognizes measurement results of the complex impedance in different degradation states of the rechargeable battery, the first calculation element specifies dependence of the parameter values of the rechargeable battery model on the degradation state of the rechargeable battery, based on the measurement results of the complex impedance in the different degradation states of the rechargeable battery recognized by the first recognition element, the second recognition element recognizes a time series of a degradation state of the simulation battery in addition to the time series of the current command value, and the second calculation element calculates a model output voltage in the case where the time series of the current command value and the time series of the degradation state of the simulation battery recognized by the second recognition element are input to the rechargeable battery model having the parameter values and the dependence of the parameter values on the degradation state of the rechargeable battery identified by the first calculation element.

In the simulation battery construction device of the present invention, it is preferable that the first recognition element recognizes a first measured output voltage and a second measured output voltage as measurement results of the manner of change of a voltage output from the rechargeable battery in response to an impulse current input to the rechargeable battery at a first designated time point and a second designated time point, respectively, the second designated time point being a time point of measurement of the complex impedance of the rechargeable battery that is later than the first designated time point, and recognizes the degradation state of the rechargeable battery at the second designated time point with respect to the rechargeable battery at the first designated time point based on a contrast between the first and second measured output voltages.

In the simulation battery construction device of the present invention, it is preferable that the first recognition element, based on a mutual communication with a designated apparatus having the rechargeable battery mounted thereon as a power supply, recognizes a voltage response characteristic of the rechargeable battery measured by a sensor mounted on the designated apparatus as each of the first and second measured output voltages as the measurement results of the manner of change of the voltage output from the rechargeable battery in the case where the impulse current generated by a pulse current generator mounted on the designated apparatus is input to the rechargeable battery.

In the simulation battery construction device of the present invention, it is preferable that the first recognition element recognizes measurement results of the complex impedance at different temperatures of the rechargeable battery, the first calculation element specifies temperature dependance of the parameter values of the rechargeable battery model based on the measurement results of the complex impedance at the different temperatures of the rechargeable battery recognized by the first recognition element, the second recognition element recognizes a measurement result of a temperature of the simulation battery or the designated apparatus in addition to the time series of the current command value, and the second calculation element calculates a model output voltage in the case where the time series of the current command value and the measurement result of the temperature of the simulation battery or the designated apparatus recognized by the second recognition element are input to the rechargeable battery model having the parameter values and the temperature dependence of the parameter values identified by the first calculation element.

In the simulation battery construction device of the present invention, it is preferable that the first recognition element, based on a mutual communication with a designated apparatus having the rechargeable battery mounted thereon as a power supply, recognizes the complex impedance of the rechargeable battery measured in accordance with an AC impedance method by a measuring instrument mounted on the designated apparatus.

BRIEF DESCRIPTION OF DRAWINGS

FIG. 10 is a diagram illustrating a result of calculation of a voltage command value from a current command value.

DESCRIPTION OF EMBODIMENTS (Configuration of Simulation Battery Construction Device)

Figure 1:
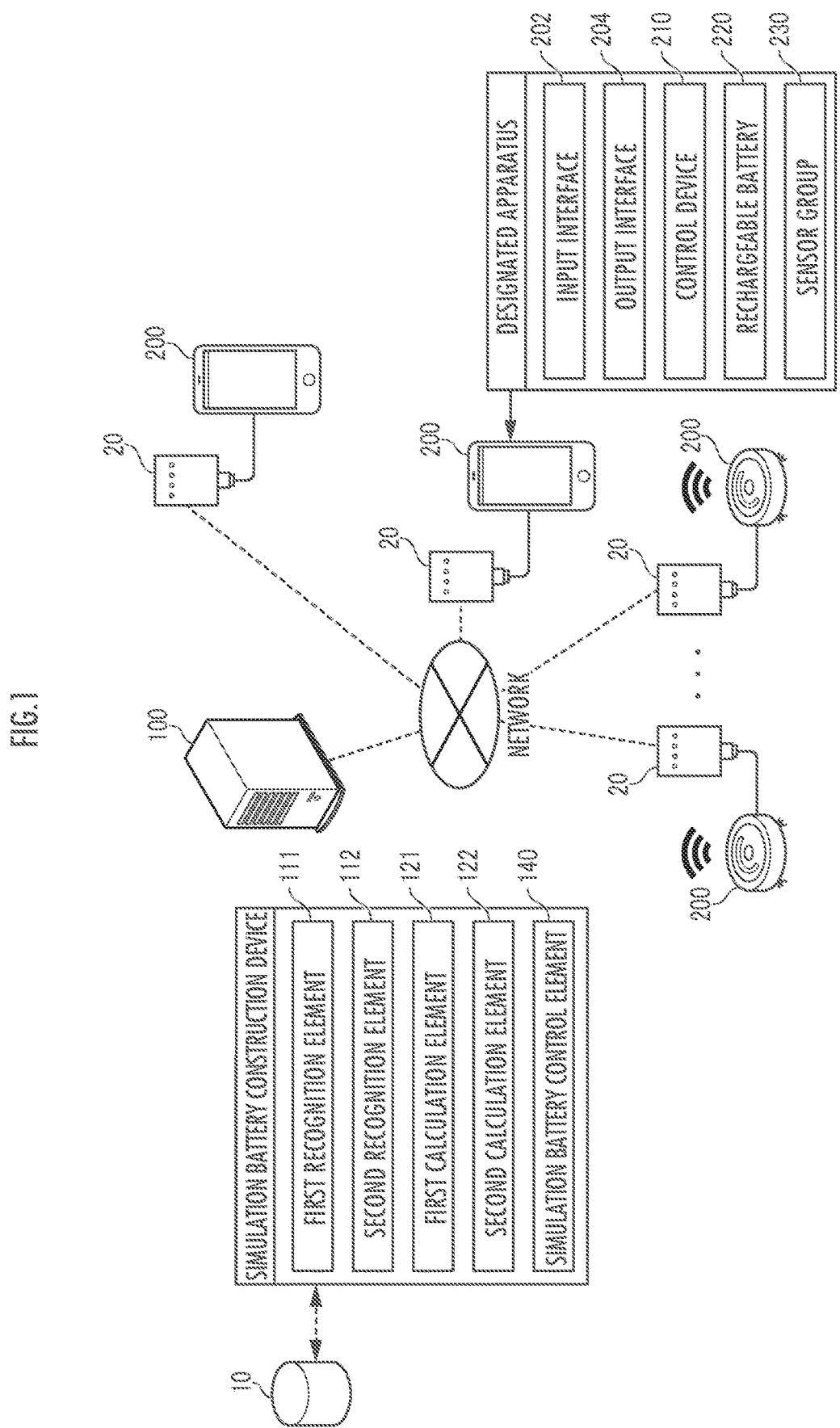
FIG. 1 is a diagram illustrating the configuration of a simulation battery construction device as an embodiment of the present invention.

The simulation battery construction device 100 as an embodiment of the present invention shown in FIG. 1 is composed of one or more servers that can communicate with each of a database 10, a simulation battery 20, and a designated apparatus 200 via a network. The simulation battery construction device 100 controls a voltage applied from the simulation battery 20 to the designated apparatus 200. The database 10 may be a constituent element of the simulation battery construction device 100.

The simulation battery construction device 100 includes a first recognition element 111, a second recognition element 112, a first calculation element 121, a second calculation element 122, and a simulation battery control element 140. The first recognition element 111, the second recognition element 112, the first calculation element 121, the second calculation element 122, and the simulation battery control element 140 are each composed of a processor (arithmetic processing unit), a memory (storage device), an I/O circuit, and others.

The memory or a separate storage device stores and retains various data such as measurement results of voltage response characteristics of a rechargeable battery 220 with respect to an impulse current, as well as programs (software). For example, a plurality of identifiers each identifying the type (as specified by standards and specifications) of a rechargeable battery 220 or a designated apparatus 200 having the rechargeable battery 220 mounted thereon and a plurality of rechargeable battery models are associated respectively, and stored and retained in the memory. The processor reads the necessary program and data from the memory and executes arithmetic processing in accordance with the program based on the data, thereby executing the arithmetic processing or tasks (described below) assigned to the respective elements 111, 112, 121, 122, and 140 constituting the simulation battery construction device 100.

Figure 2:
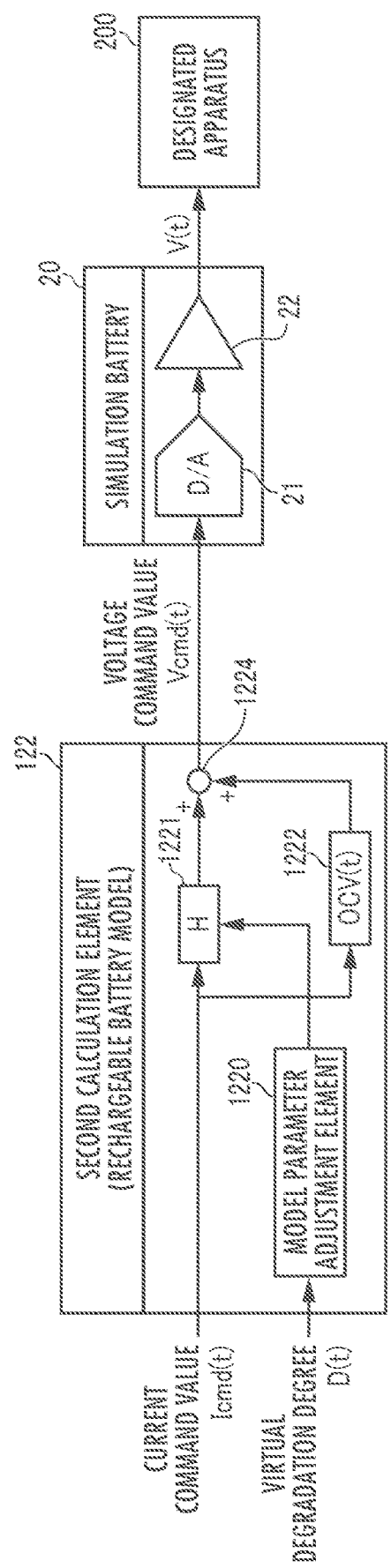
FIG. 2 is a diagram illustrating an exemplary configuration of a simulation battery.

As shown in FIG. 2, the simulation battery 20 includes a D/A converter 21 and an amplifier 22. The D/A converter 21, when receiving a voltage command value Vcmd(t) output from a rechargeable battery model, D/A converts the received value. The amplifier 22 applies a voltage V(t) according to the output from the D/A converter 21 to the designated apparatus 200 or a load constituting the apparatus 200. Here, "(t)" means a value or a time series at time t.

The calculator (second calculation element 122) corresponding to the rechargeable battery model includes a calculator 1221, an output unit 1222, and an adder 1224. The calculator 1221, when receiving a current command value Icmd(t), computes an output voltage derived from a virtual internal resistance of the simulation battery 20. The current command value Icmd(t) may be provided from the designated apparatus 200. The values of parameters defining a transfer function H of the calculator 1221 are adjusted by a model parameter adjustment element 1220 based on a degradation degree D(m2) of a virtual rechargeable battery simulated by the simulation battery 20. The output unit 1222 outputs a virtual open-circuit voltage OCV(t) of the simulation battery 20. The adder 1224 adds up the outputs of the calculator 1221 and the output unit 1222.

The simulation battery 20 may be configured with an external power supply such as a commercial power supply to which the designated apparatus 200 is connected. The simulation battery 20 may be mounted on the designated apparatus 200 in place of the rechargeable battery 220. The simulation battery 20 may include the second calculation element 122. In this case, the second calculation element 122 may be configured with a control device 210 constituting the designated apparatus 200.

The designated apparatus 200 includes an input interface 202, an output interface 204, the control device 210, the rechargeable battery 220, and a sensor group 230. The designated apparatus 200 includes any apparatus that uses the rechargeable battery 220 as a power supply, such as a personal computer, cellular phone (smartphone), home appliance, or mobile body such as an electric bicycle.

The control device 210 is composed of a processor (arithmetic processing unit), a memory (storage device), an I/O circuit, and others. The memory or a separate storage device stores and retains various data such as the measurement results of the voltage response characteristics of the rechargeable battery 220. The control device 210 operates in response to the power supplied from the rechargeable battery 220 and controls the operation of the designated apparatus 200 in the energized state. The operation of the designated apparatus 200 includes the operation of an actuator (such as an electric actuator) that constitutes the designated apparatus 200. The processor constituting the control device 210 reads the necessary program and data from the memory, and executes the arithmetic processing assigned in accordance with the program based on the data.

The rechargeable battery 220 is, for example, a lithium-ion battery, and may be any other rechargeable battery such as a nickel-cadmium battery. In the case where power is supplied from the simulation battery 20 to the designated apparatus 200, the rechargeable battery 220 may be removed from the designated apparatus 200. The sensor group 230 measures the voltage response characteristics and temperature of the rechargeable battery 220, as well as the values of parameters necessary for controlling the designated apparatus 200. The sensor group 230 includes, for example, a voltage sensor, a current sensor, and a temperature sensor that output signals corresponding respectively to the voltage, current, and temperature of the rechargeable battery 220.

The simulation battery construction device 100 may be installed in the designated apparatus 200. In this case, a software server (not shown) may transmit degradation determining software to the arithmetic processing unit constituting the control device 210 included in the designated apparatus 200, thereby imparting the functions as the simulation battery construction device 100 to the arithmetic processing unit.

(Simulation Battery Construction Method)

A description will now be made of a simulation battery construction method which is performed by the simulation battery construction device 100 of the above configuration.

Parameters P(n0,n1,n2) of a rechargeable battery model at each of different temperatures T(n1) at each of different degradation degrees D(n2) are determined for various types of rechargeable batteries 220 having their types identified by the identifier id(n0).

Figure 3:
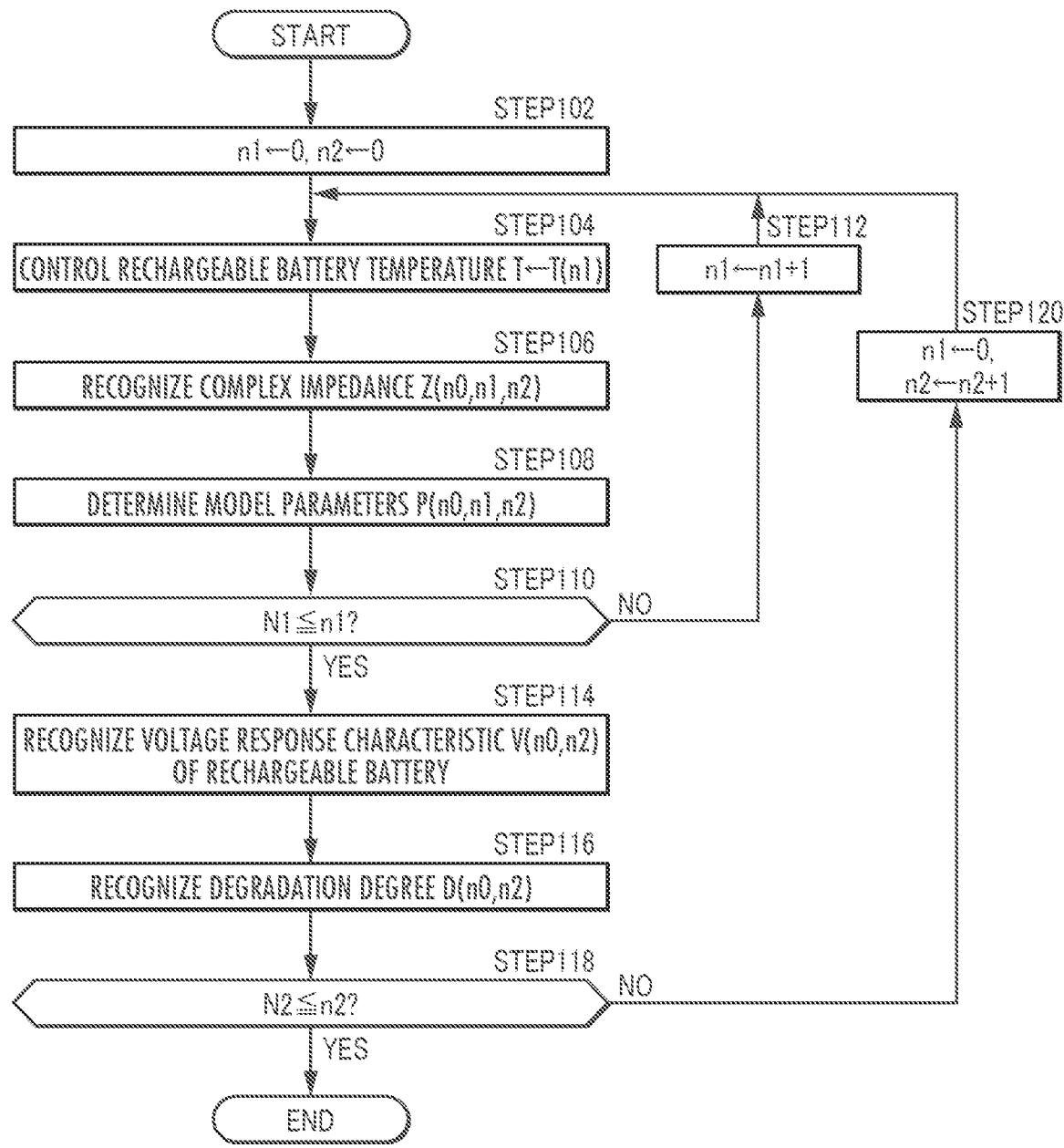
FIG. 3 is a flowchart illustrating the preparation procedure for a simulation battery construction method of a rechargeable battery.

Specifically, firstly, in the simulation battery construction device 100, a first index n1 and a second index n2 are each set to "0" (STEP 102 in FIG. 3). The first index n1 is an index that represents the high or low of temperature T of the rechargeable battery 220. The second index n2 is an index that represents the number of times of the evaluation made, or the order of the evaluation period, of the degradation degree D of the rechargeable battery 220.

The temperature T of the rechargeable battery 220 is controlled to a temperature T(n1) (STEP 104 in FIG. 3). For the temperature adjustment of the rechargeable battery 220, a heater (such as an electric heater) and a cooler (such as a cooling fan) placed near the rechargeable battery 220, as well as a temperature sensor placed near the rechargeable battery 220 or attached to the housing of the rechargeable battery 220 are used.

The first recognition element 111 recognizes a measurement result of a complex impedance Z(n0,n1,n2) of the rechargeable battery 220 (STEP 106 in FIG. 3). For each element to "recognize" information means to perform any arithmetic processing, etc. for preparing necessary information, which includes to receive information, to retrieve or read information from the database 10 or other information source, and to calculate or estimate information based on other information. The complex impedance Z(n0,n1,n2) of the rechargeable battery 220 is measured with the AC impedance method, and the measurement result is registered in the database 10 in association with an identifier for identifying the type of the rechargeable battery 220.

Figure 5:
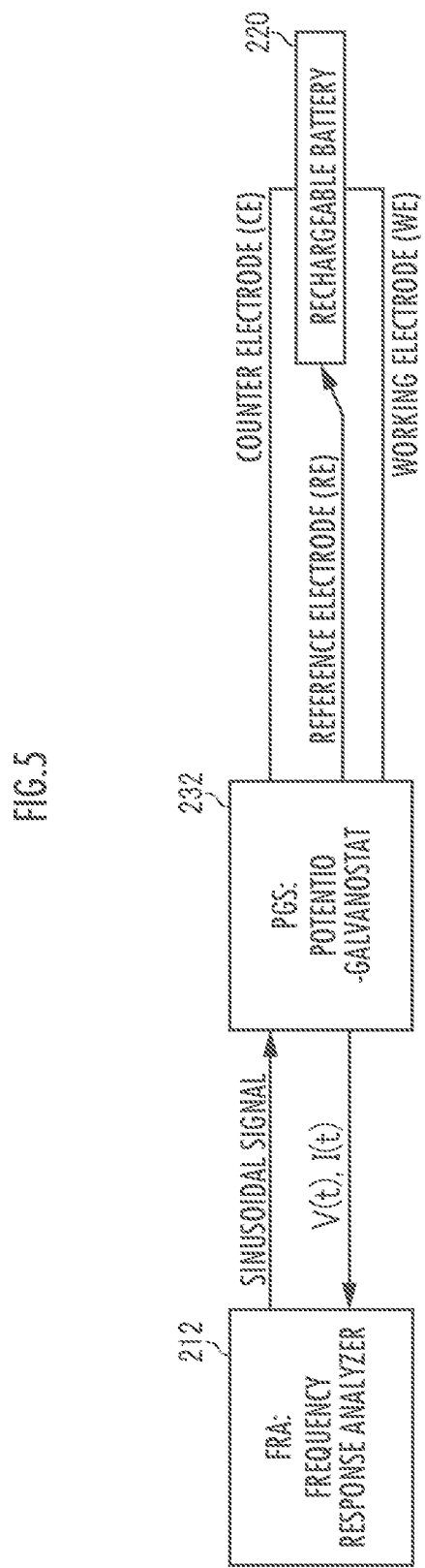
FIG. 5 is a diagram illustrating a system for measuring a complex impedance of a rechargeable battery.

According to the AC impedance method, a combination of a frequency response analyzer (FRA) 212 and a potentio-galvanostat (PGS) 232 is used, as shown in FIG. 5. An oscillator constituting the FRA 212 outputs a sinusoidal signal of an arbitrary frequency, and a current signal I(t) and a voltage signal V(t) of the rechargeable battery 220 according to the sinusoidal signal are input from the PGS 232 to the FRA 212. In the FRA 212, the current signal I(t) and the voltage signal V(t) are converted into frequency domain data by means of discrete Fourier frequency transform, and the complex impedance Z(n0,n1,n2)(co) at the frequency f=(o)/2π) is measured.

For example, the complex impedance Z(n0,n1,n2) of the rechargeable battery 220 in the state of not being mounted on the designated apparatus 200, such as immediately before shipment of the rechargeable battery 220, is measured. Alternatively, the complex impedance Z(n0,n1,n2) of the rechargeable battery 220 in the state of being mounted on the designated apparatus 200 may be measured. In this case, the FRA 212 may be configured with the control device 210, and the sensor group 230 may be configured with the PGS 232.

For example, the designated apparatus 200 may be connected to an external power supply such as a commercial power supply for the purpose of charging the rechargeable battery 220, and a sinusoidal signal may be output with the power supplied from the external power supply.

Figure 6:
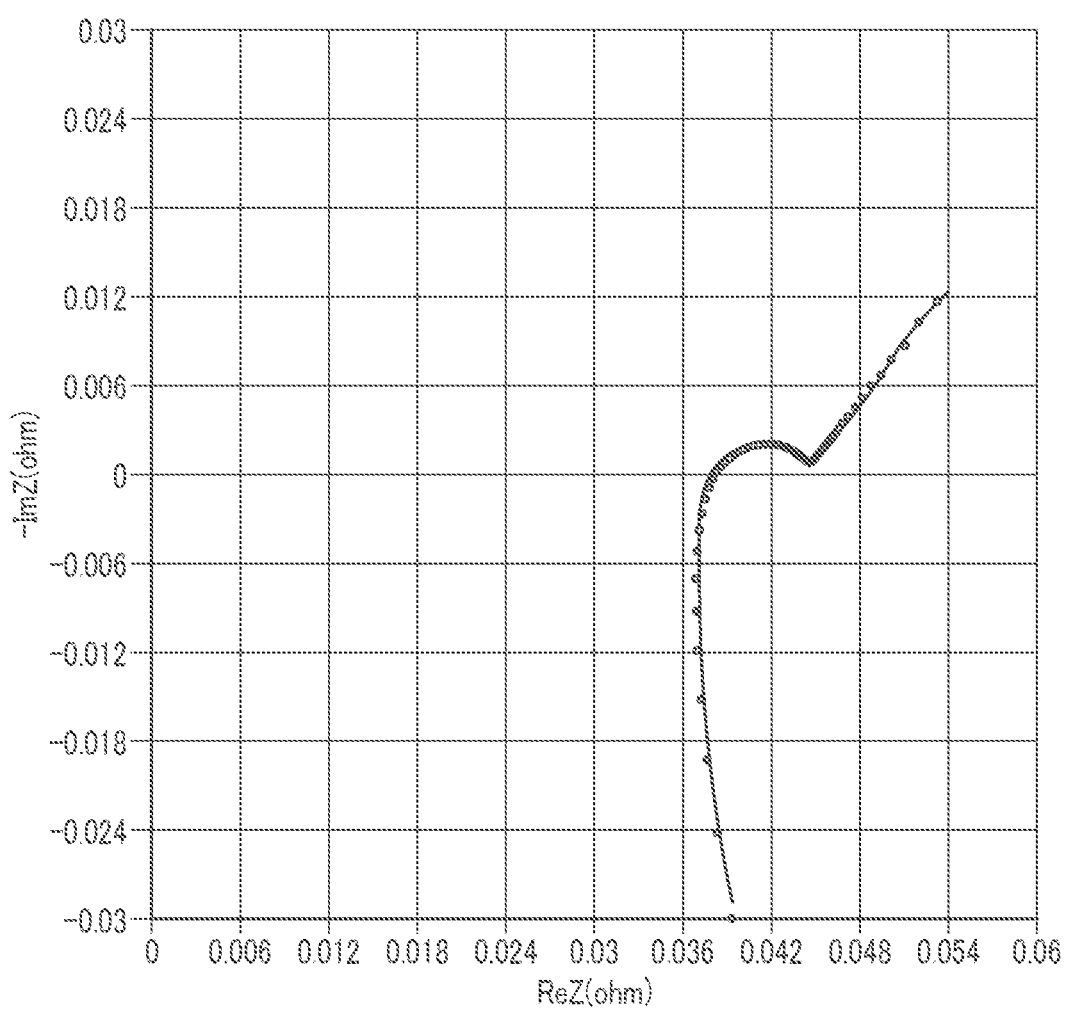
FIG. 6 is a diagram illustrating a Nyquist plot of a rechargeable battery.

FIG. 6 shows an example of a Nyquist plot representing the actual measurement results of the complex impedance Z(n0,n1,n2) of the rechargeable battery 220, together with an approximate curve of the plot. The horizontal axis represents real part ReZ of the complex impedance Z, and the vertical axis represents imaginary part −ImZ of the complex impedance Z. The larger ReZ in the region of −ImZ>0 represents the complex impedance Z at lower frequencies. The value of ReZ when −ImZ=0 corresponds to the transfer resistance in the electrolytic solution of the rechargeable battery 220. The radius of curvature of the approximately semicircular portion in the region of −ImZ>0 corresponds to the charge transfer resistance of the rechargeable battery 220. The radius of curvature tends to become smaller as the temperature T of the rechargeable battery 220 becomes higher. The linear portion rising at about 45° in the low frequency region of the region of −ImZ>0 reflects the effect of the Warburg impedance of the rechargeable battery 220.

(Establishment of Rechargeable Battery Model)

In the simulation battery construction device 100, values of parameters P(n0,n1,n2) of a rechargeable battery model are identified by the first calculation element 121 based on the measurement result of the complex impedance Z of the rechargeable battery 220 recognized by the first recognition element 111 (STEP 108 in FIG. 3). The parameters P(n0, n1,n2) define the transfer function H of the calculator 1221.

The rechargeable battery model is a model that expresses a voltage V(t) output from a rechargeable battery 220 when a current I(t) is input to the rechargeable battery 220. It is defined using an open-circuit voltage OCV and a transfer function H(t) of the internal resistance of the rechargeable battery 220 by the relational expression (01).

$$V(t)=OCV(t)+H(t)\cdot I(t) \qquad (01)$$

Here, OCV(t) indicates that the open-circuit voltage increases or decreases as the current I(t) is charged and/or discharged.

A transfer function H(z) of an equivalent circuit model of the internal resistance of a rechargeable battery is defined by the following relational expression (02).

$$H(z)=H_0(z)+\Sigma_{i=1\sim m}H_i(z)+H_W(z)+H_L(z) \qquad (02)$$

Here, "$H_0(z)$", "$H_i(z)$", "$H_W(z)$", and "$H_L(z)$" are defined by parameters that represent the characteristics of the internal resistance of the rechargeable battery.

Figure 7A:
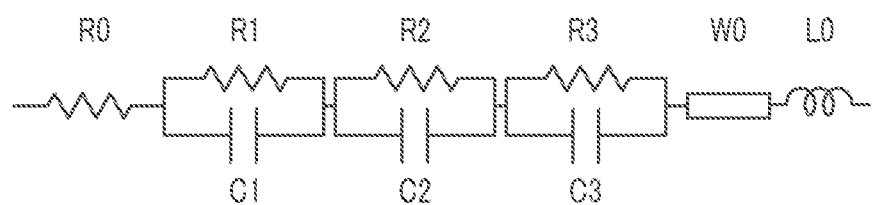
FIG. 7A is a diagram illustrating a first example of an equivalent circuit of the internal resistance of a rechargeable battery.
Figure 7B:
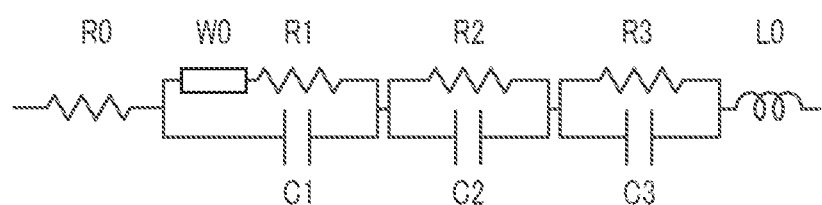
FIG. 7B is a diagram illustrating a second example of the equivalent circuit of the internal resistance of a rechargeable battery.

FIG. 7A shows an example of an equivalent circuit of the internal resistance of the rechargeable battery 220. In this example, the equivalent circuit of the internal resistance is defined by a series circuit of: a resistor $R_0$, corresponding to the transfer resistance in the electrolytic solution; the i-th RC parallel circuit (i=1, 2, . . . , X) consisting of a resistor $R_i$ and a capacitor $C_i$, corresponding to the charge transfer resistance; a resistor $W_0$, corresponding to the Warburg impedance; and a coil L. Although the number of series-connected RC parallel circuits is "3" in the example shown in FIG. 7A, it can be smaller or larger than 3. The resistor $W_0$ may be connected in series with the resistor R in at least one RC parallel circuit. The capacitor C may be replaced by a constant phase element (CPE). As shown in FIG. 7B, the Warburg resistor, $W_0$, may be connected in series with the resistor R in at least one RC parallel circuit (the first RC parallel circuit in the example of FIG. 7B).

The transfer function $H_0(z)$ of the resistor $R_0$ is defined by the relational expression (031).

$$H_0(z)=R_0 \qquad (031)$$

Figure 8A:
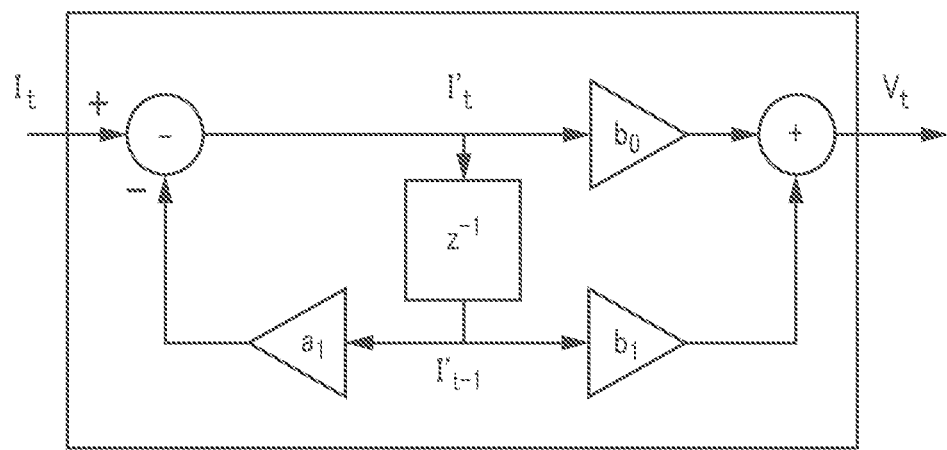
FIG. 8A is a diagram representing the transfer function of an IIR system.

The transfer function $H_i(z)$ of the i-th RC parallel circuit is defined as a transfer function of an infinite impulse response (IIR) system by the relational expression (032). FIG. 8A shows a block diagram representing the transfer function $H_i(z)$ of the i-th RC parallel circuit.

$$H_i(z)=(b_0+b_iz^{-1})/(1+a_iz^{-1}) \qquad (032)$$

Figure 8B:
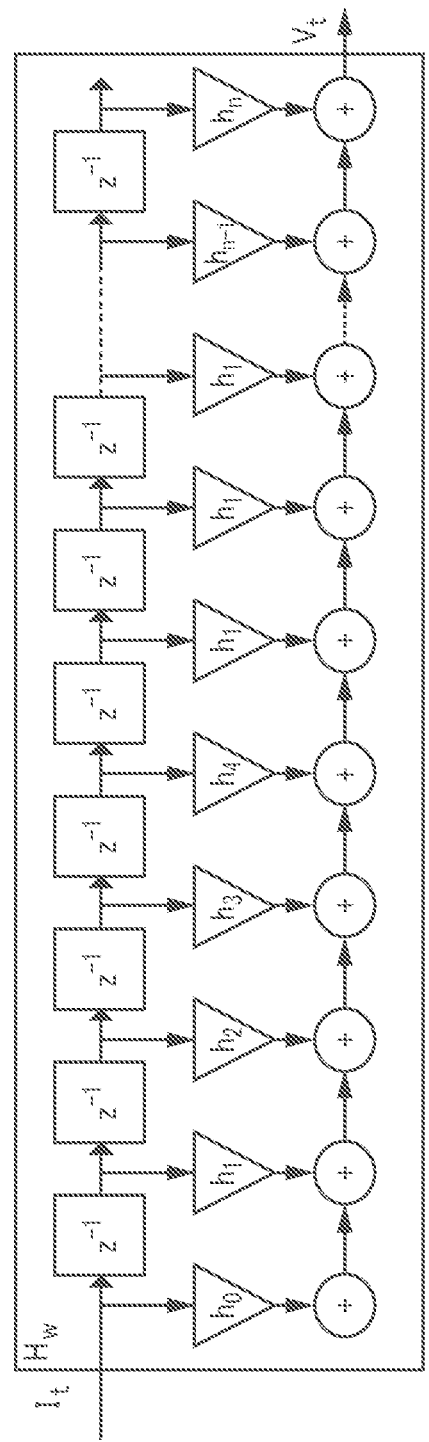
FIG. 8B is a diagram representing the transfer function of an FIR system.

The transfer function $H_W(z)$ of the resistor $W_0$ corresponding to the Warburg impedance is defined as a transfer function of a finite impulse response (FIR) system by the relational expression (04). FIG. 8B shows a block diagram representing the transfer function $H_W(z)$ of the resistor $W_0$ corresponding to the Warburg impedance.

$$H_W(z)=\Sigma_{k=0\sim n}h_kz^{-k} \qquad (04)$$

The transfer function $H_L(z)$ of the coil L is defined by the relational expression (05).

$$H_L(z)=(2L_0/T)(1-z^{-1})/(1+z^{-1}) \qquad (05)$$

An approximate curve of the complex impedance Z of the rechargeable battery represented by the Nyquist plot, shown with a solid line in FIG. 6, is obtained under the assumption that the transfer function H(z) of the equivalent circuit model of the internal resistance of the rechargeable battery is defined according to the relational expression (02). This allows the values of the parameters P(n0,n1,n2)={$R_0$, $a_i$, $b_0$, $b_i$, $h_k$, $L_0$, T} to be obtained (see the relational expressions (03) to (05)). The value of the open-circuit voltage OCV(t) output from the output unit 1222 in the rechargeable battery model is identified by the measurement value of the open-circuit voltage OCV(n0,n1,n2) (see the relational expression (01)). Then, depending on the values of the parameters, the rechargeable battery models are established for various types of rechargeable batteries 220.

It is determined whether the first index n1 is a predetermined number N1 or larger (STEP 110 in FIG. 3). If the determination result is negative (NO in STEP 110 in FIG. 3), the value of the first index n1 is increased by "1" (STEP 112 in FIG. 3). Then, the process of temperature adjustment of the rechargeable battery 220 and on are repeated (STEPS 104→106→108→110 in FIG. 3).

(Determination of Degradation Degree)

If the determination result is positive (YES in STEP 110 in FIG. 3), the second recognition element 112 recognizes the measurement result of the voltage response characteristic V(n0,n2)(t) (−V(n0,n2)(z)) according to the impulse current I(t) of the rechargeable battery 220 (STEP 114 in FIG. 3).

Figure 9A:
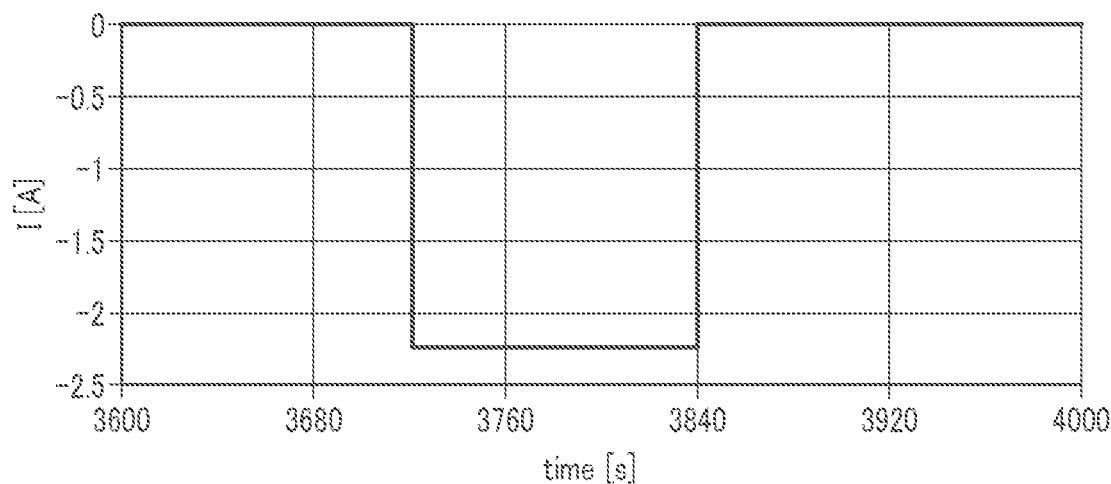
FIG. 9A is a diagram illustrating an impulse current.

During the measurement, the impulse current I(t) (— I(z)) is input to the rechargeable battery 220. For example, the impulse current I(t) as shown in FIG. 9A is input to the rechargeable battery 220. When a pulse current generator is driven, the impulse current I(t) generated in the pulse current generator is input to the rechargeable battery 220. In the case where the rechargeable battery 220 is mounted on the designated apparatus 200, the pulse current generator may be mounted on the designated apparatus 200. The pulse current generator mounted on the designated apparatus 200 may be driven by power that is supplied from an external power supply or an auxiliary power supply mounted on the designated apparatus 200.

Figure 9B:
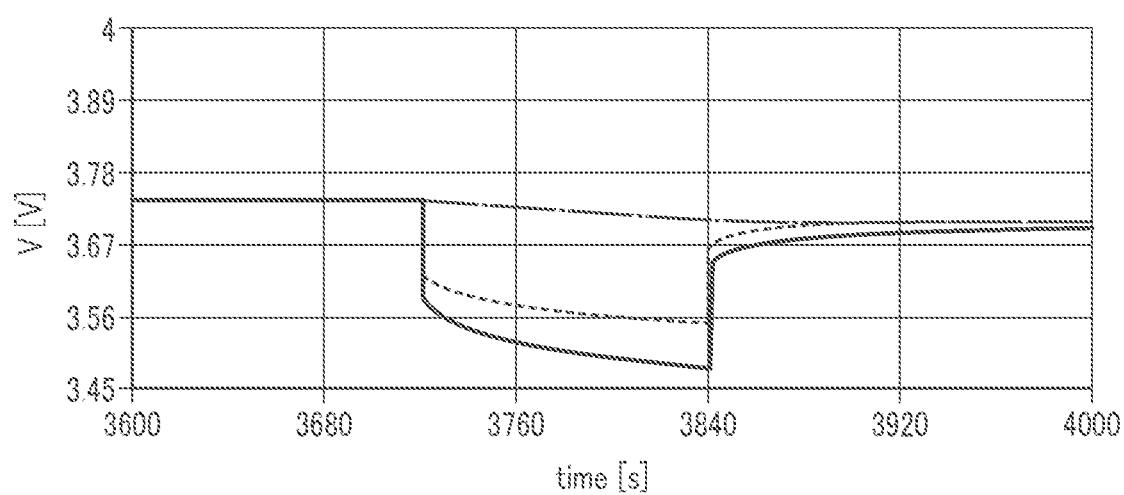
FIG. 9B is a diagram illustrating the voltage response characteristics of a rechargeable battery and a rechargeable battery model.

Then, on the basis of the output signal of the voltage sensor, the control device 210 measures the voltage response characteristic V(n0,n2)(t) of the rechargeable battery 220. In the case where the rechargeable battery 220 is mounted on the designated apparatus 200, the voltage response characteristic V(n0,n2)(t) of the rechargeable battery 220 may be measured by the control device 210 on the basis of the output signal of the voltage sensor constituting the sensor group 230 mounted on the designated apparatus 200. In this manner, the voltage response characteristic V(n0,n2)(t) of the rechargeable battery 220, which varies as shown by the broken line in FIG. 9B, for example, is measured. In FIG. 9B, the measurement result of the voltage response characteristic V(n0,0)(t) of the rechargeable battery 220 when the second index n2 is 0 is shown by the solid line.

Subsequently, the second calculation element 122 evaluates the degradation degree D(n0,n2) of the rechargeable battery 220 having its type identified by the identifier id(n0), on the basis of the result of contrast between the voltage response characteristics V(n0,n2)(t) and V(n0,0)(t) of the rechargeable battery 220 (STEP 116 in FIG. 3). For example, the similarity x between the curves representing the voltage response characteristics V(n0,n2)(t) and V(n0,0)(t), respectively, of the rechargeable battery 220 is calculated. Then, the degradation degree D(n0,n2)=f(x) of the rechargeable battery 220 is calculated in accordance with a decreasing function $f$ with the similarity x as the main variable.

It is determined whether the second index n2 is a predetermined number N2 or larger (STEP 118 in FIG. 3) If the determination result is negative (NO in STEP 118 in FIG. 3), the value of the first index n1 is reset to "0" and the value of the second index n2 is increased by "1" (STEP 120 in FIG. 3). Then, the process of temperature adjustment of the rechargeable battery 220 and on are repeated (STEPS 104→106→108→110 in FIG. 3).

(Construction of Simulation Battery)

Figure 4:
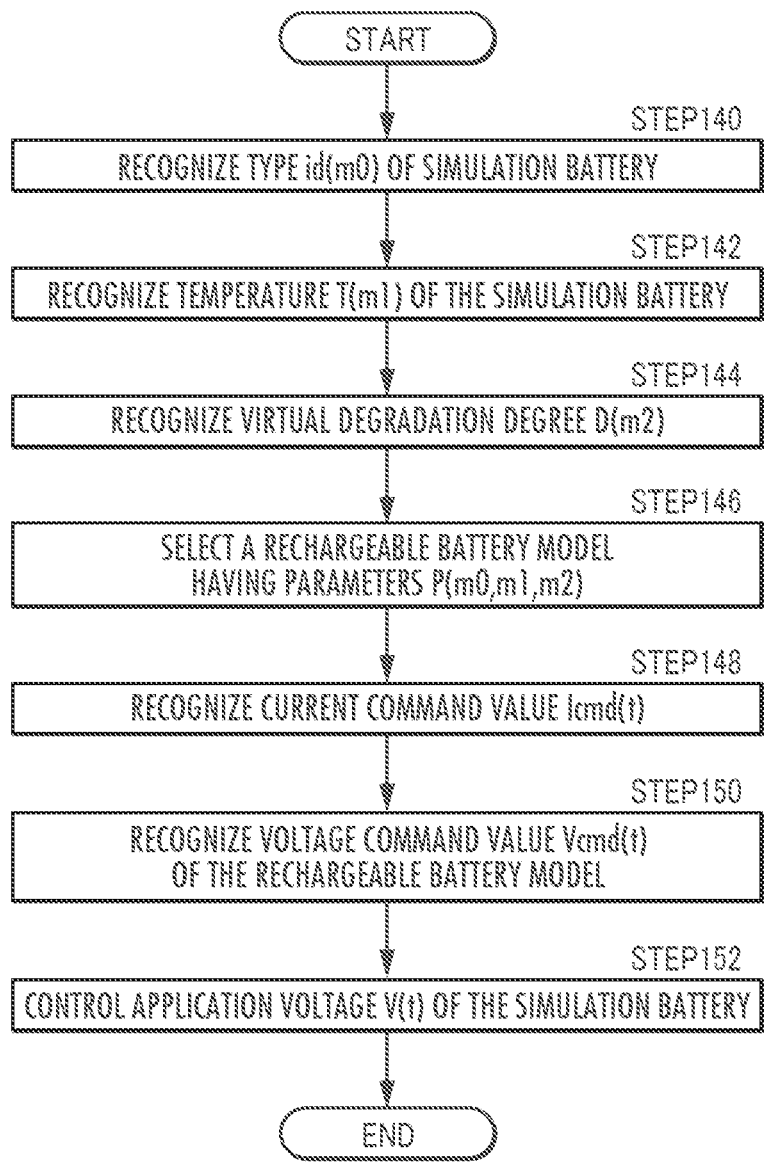
FIG. 4 is a flowchart illustrating the procedure of the simulation battery construction method of a rechargeable battery.

The second recognition element 112 recognizes an identifier id(m0) that identifies the type of a virtual rechargeable battery to be simulated by the simulation battery 20 (STEP 140 in FIG. 4). For example, the second recognition element 112 may recognize, on the basis of a communication with the designated apparatus 200, the identifier id(m0) that identifies the type of the rechargeable battery that is planned to be applied to the designated apparatus 200. Alternatively, the identifier id(m0) may be recognized by the second recognition element 112, on the basis of the communication with the designated apparatus 200, in accordance with the virtual rechargeable battery type that has been set through the input interface 202 of the designated apparatus 200.

The second recognition element 112 recognizes the temperature T(m1) of the virtual rechargeable battery simulated by the simulation battery 20 (STEP 142 in FIG. 4). For example, the second recognition element 112 may recognize, on the basis of the communication with the designated apparatus 200, the temperature of the designated apparatus 200 measured by a temperature sensor constituting the sensor group 230 of the designated apparatus 200 as the temperature T(m1) of the virtual rechargeable battery. Alternatively, the second recognition element 112 may recognize, on the basis of the communication with the designated apparatus 200, a temperature that has been set through the input interface 202 of the designated apparatus 200 as the temperature T(m1) of the virtual rechargeable battery.

The second recognition element 112 recognizes the degradation degree D(m2) of the virtual rechargeable battery simulated by the simulation battery 20 (STEP 144 in FIG. 4). For example, the second recognition element 112 may recognize, on the basis of the communication with the designated apparatus 200, the degradation degree that has been set through the input interface 202 of the designated apparatus 200 as the degradation degree D(m2) of the virtual rechargeable battery.

The second calculation element 122 selects, from among a large number of rechargeable battery models registered in the database 10, one rechargeable battery model that is specified by the parameters P(m0, m1, m2) on the basis of the recognition results by the second recognition element 112 of the identifier id(m0) identifying the type, the temperature T(m1), and the degradation degree D(m2) of the virtual rechargeable battery simulated by the simulation battery 20 (STEP 146 in FIG. 4). This corresponds to the event that the values of the parameters P(n0,n1,n2), which define the transfer function H of the calculator 1221 shown in FIG. 2, are adjusted by the model parameter adjustment element 1220 on the basis of the degradation degree D(m2) of the virtual rechargeable battery simulated by the simulation battery 20.

In addition, the second recognition element 112 recognizes a current command value Icmd(t) (STEP 148 in FIG. 4). For example, the second recognition element 112 may recognize, on the basis of the communication with the designated apparatus 200, a desired current value for the load that is set by the control device 210 according to the operating status of the designated apparatus 200 measured by the sensor group 230 of the designated apparatus 200, as the current command value Icmd(t). Alternatively, the second recognition element 112 may recognize, on the basis of the communication with the designated apparatus 200, a desired current value that has been set through the input interface 202 of the designated apparatus 200, as the current command value Icmd(t). With this, the current command value Icmd(t) that varies with time as shown by the solid line in FIG. 10, for example, is recognized.

The second calculation element 122 inputs the current command value Icmd(t) to the selected rechargeable battery model, and calculates a voltage command value Vcmd(t) as the output of the rechargeable battery model (STEP 150 in FIG. 4). With this, the voltage command value Vcmd (t) that varies as shown by the thin line in FIG. 10, for example, is calculated as the output of the rechargeable battery model.

Subsequently, the simulation battery control element 140 performs control such that a voltage V(t) obtained by multiplying the voltage command value Vcmd(t) by a gain by the amplifier 22 in the simulation battery 20 is applied to the designated apparatus 200 or a designated load constituting the designated apparatus 200 (STEP 152 in FIG. 4). In this manner, the voltage V(t) that varies as shown by the bold line in FIG. 10, for example, is applied to the designated apparatus 200.

OTHER EMBODIMENTS OF THE PRESENT INVENTION

In the above embodiment, the values of the parameters P(n0,n1,n2) of the rechargeable battery models were individually determined according to the differences in the degradation degree D(n2) of the rechargeable batteries 220 having their types identified by the identifier id(n0) (see STEPS 108, 114, and 116 in FIG. 3). As another embodiment, the values of the parameters P(n0,n1) of the rechargeable battery models may be determined without taking into account the differences in the degradation degree D(n2) of the rechargeable batteries 220.

In the above embodiment, the values of the parameters P(n0,n1,n2) of the rechargeable battery models were individually determined according to the differences in the temperature T(n1) of the rechargeable batteries 220 having their types identified by the identifier id(n0) (see STEPS 104, 114, and 116 in FIG. 3). As another embodiment, the values of the parameters P(n0,n2) of the rechargeable battery models may be determined without taking into account the differences in the temperature T(n1) of the rechargeable batteries 220.

Effects of the Invention

According to the simulation battery construction device 100 and the simulation battery construction method performed by the same according to the present invention, the parameters P(n0,n1,n2) of a rechargeable battery model at each of different temperatures T(n1) at each of different degradation degrees D(n2) are determined for a rechargeable battery 220 having its type identified by the identifier id(n0). On the basis of the measurement result of the complex impedance Z of the rechargeable battery 220, the values of the parameters P(n0,n1,n2) of the rechargeable battery model are identified (see STEPS 104→106→108 in FIG. 3; FIGS. 5, 6, 7A, 7B, 8A, and 8B). The rechargeable battery model expresses the impedance of the internal resistance of the rechargeable battery 220 with the transfer functions that represent the IIR and FIR systems, respectively (see the relational expressions (03) and (04); FIGS. 5, 6, 7A, 7B, 8A, and 8B).

Further, on the basis of the identifier id(m0), temperature T(m1), and degradation degree D(m2) of the virtual rechargeable battery to be simulated by the simulation battery 20, a rechargeable battery model having the parameters P(m0,m1,m2) is selected (see FIG. 2; STEPS 140→142→144→146 in FIG. 4). Then, the voltage command value Vcmd(t), which is the output when the current command value Icmd(t) is input to the rechargeable battery model, is calculated, and the voltage V(t) according thereto is applied to the designated apparatus 200 or its load by the simulation battery 20 (see FIG. 2; STEPS 148→150→152 in FIG. 4; FIG. 10). This can improve the accuracy in reproduction of the characteristics of the rechargeable battery 220 by the simulation battery 20 under various conditions.

DESCRIPTION OF REFERENCE NUMERALS

10: database; 20: simulation battery; 22: amplifier; 100: simulation battery construction device; 111: first recognition element; 112: second recognition element; 121: first calculation element; 122: second calculation element; 140: simulation battery control element; 200: designated apparatus; 202: input interface; 204: output interface; 210: control device; 220: rechargeable battery; and 230: sensor group.

The invention claimed is:

1. A simulation battery construction device comprising:
a processor configured to function as:
a first recognition element configured to recognize a measurement result of a complex impedance of a rechargeable battery;
a first calculation element configured to identify parameter values of a rechargeable battery model based on the measurement result of the complex impedance of the rechargeable battery recognized by the first recognition element, the rechargeable battery model expressing an impedance of an internal resistance of the rechargeable battery with transfer functions representing an IIR system and an FIR system, respectively;
a second recognition element configured to recognize a time series of a current command value;
a second calculation element configured to calculate a time series of voltage simulating the rechargeable battery as an output of the rechargeable battery model by inputting the time series of the current command value recognized by the second recognition element to the rechargeable battery model; and
a simulation battery control element configured to control an operation of a simulation battery connected to a designated apparatus so as to cause the time series of the voltage simulating the rechargeable battery calculated by the second calculation element to be applied to the designated apparatus.

2. The simulation battery construction device according to claim 1, wherein
the first recognition element recognizes measurement results of the complex impedance in different degradation states of the rechargeable battery,
the first calculation element specifies dependence of the parameter values of the rechargeable battery model on the degradation state of the rechargeable battery, based on the measurement results of the complex impedance in the different degradation states of the rechargeable battery recognized by the first recognition element,
the second recognition element recognizes a time series of a degradation state of the simulation battery in addition to the time series of the current command value, and
the second calculation element calculates a model output voltage in the case where the time series of the current command value and the time series of the degradation state of the simulation battery recognized by the second recognition element are input to the rechargeable battery model having the parameter values and the dependence of the parameter values on the degradation state of the rechargeable battery identified by the first calculation element.

3. The simulation battery construction device according to claim 2, wherein
the first recognition element recognizes a first measured output voltage and a second measured output voltage as measurement results of a manner of change of a voltage output from the rechargeable battery in response to an impulse current input to the rechargeable battery at a first designated time point and a second designated time point, respectively, the second designated time point being a time point of measurement of the complex impedance of the rechargeable battery that is later than the first designated time point, and recognizes the degradation state of the rechargeable battery at the second designated time point with respect to the rechargeable battery at the first designated time point based on a contrast between the first and second measured output voltages.

4. The simulation battery construction device according to claim 3, wherein
the first recognition element, based on a mutual communication with a designated apparatus having the rechargeable battery mounted thereon as a power supply, recognizes a voltage response characteristic of the rechargeable battery measured by a sensor mounted on the designated apparatus as each of the first and second measured output voltages as the measurement results of the manner of change of the voltage output from the rechargeable battery in a case where an impulse current generated by a pulse current generator mounted on the designated apparatus is input to the rechargeable battery.

5. The simulation battery construction device according to claim 1, wherein
the first recognition element recognizes measurement results of the complex impedance at different temperatures of the rechargeable battery,
the first calculation element specifies temperature dependance of the parameter values of the rechargeable battery model based on the measurement results of the complex impedance at the different temperatures of the rechargeable battery recognized by the first recognition element,
the second recognition element recognizes a measurement result of a temperature of the simulation battery or the designated apparatus in addition to the time series of the current command value, and
the second calculation element calculates a model output voltage in the case where the time series of the current command value and the measurement result of the temperature of the simulation battery or the designated apparatus recognized by the second recognition element are input to the rechargeable battery model having the parameter values and the temperature dependence of the parameter values identified by the first calculation element.

6. The simulation battery construction device according to claim 1, wherein
the first recognition element, based on a mutual communication with a designated apparatus having the rechargeable battery mounted thereon as a power supply, recognizes the complex impedance of the rechargeable battery measured in accordance with an AC impedance method by a measuring instrument mounted on the designated apparatus.

7. The simulation battery construction device according to claim 1, wherein the simulation battery comprises a D/A converter and an amplifier.

8. A system comprising the simulation battery construction device according to claim 1, and the simulation battery.

9. The system according to claim 8, wherein the system further comprises the designated apparatus or a load constituting the designated apparatus.

10. The system according to claim 8, wherein the simulation battery comprises a D/A converter and an amplifier.

11. A simulation battery construction method comprising:
a first recognition step of recognizing a measurement result of a complex impedance of a rechargeable battery;
a first calculation step of identifying parameter values of a rechargeable battery model based on the measurement result of the complex impedance of the rechargeable battery recognized in the first recognition step, the rechargeable battery model expressing an impedance of an internal resistance of the rechargeable battery with transfer functions representing an IIR system and an FIR system, respectively;
a second recognition step of recognizing a time series of a current command value;
a second calculation step of calculating a time series of voltage simulating the rechargeable battery as an output of the rechargeable battery model by inputting the time series of the current command value recognized in the second recognition step to the rechargeable battery model; and
a simulation battery control step of controlling an operation of a simulation battery connected to a designated apparatus so as to cause the time series of the voltage simulating the rechargeable battery calculated in the second calculation step to be applied to the designated apparatus.

12. The simulation battery construction method according to claim 11, wherein
the first recognition step includes recognizing measurement results of the complex impedance in different degradation states of the rechargeable battery, the first calculation step includes specifying dependence of the parameter values of the rechargeable battery model on the degradation state of the rechargeable battery, based on the measurement results of the complex impedance in the different degradation states of the rechargeable battery recognized in the first recognition step,
the second recognition step includes recognizing a time series of a degradation state of the simulation battery in addition to the time series of the current command value, and
the second calculation step includes calculating a model output voltage in the case where the time series of the current command value and the time series of the degradation state of the simulation battery recognized in the second recognition step are input to the rechargeable battery model having the parameter values and the dependence of the parameter values on the degradation state of the rechargeable battery identified in the first calculation step.

13. The simulation battery construction method according to claim 12, wherein
the first recognition step includes recognizing a first measured output voltage and a second measured output voltage as measurement results of a manner of change of a voltage output from the rechargeable battery in response to an impulse current input to the rechargeable battery at a first designated time point and a second designated time point, respectively, the second designated time point being a time point of measurement of the complex impedance of the rechargeable battery that is later than the first designated time point, and recognizing the degradation state of the rechargeable battery at the second designated time point with respect to the rechargeable battery at the first designated time point based on a contrast between the first and second measured output voltages.

14. The simulation battery construction method according to claim 7, wherein
the first recognition step includes recognizing measurement results of the complex impedance at different temperatures of the rechargeable battery,
the first calculation step includes specifying temperature dependance of the parameter values of the rechargeable battery based on the measurement results of the complex impedance at the different temperatures of the rechargeable battery recognized in the first recognition step,
the second recognition step includes recognizing a measurement result of a temperature of the simulation battery or the designated apparatus in addition to the time series of the current command value, and
the second calculation step includes calculating a model output voltage in the case where the time series of the current command value and the measurement result of the temperature of the simulation battery or the designated apparatus recognized in the second recognition step are input to the rechargeable battery model having the parameter values and the temperature dependence of the parameter values identified in the first calculation step.

15. The simulation battery construction method according to claim 11, wherein the simulation battery comprises a D/A converter and an amplifier.

* * * * *